United States Patent [19]

Gottlieb

[11] 4,324,040
[45] Apr. 13, 1982

[54] TOOL FOR REMOVING INTEGRATED CIRCUITS FROM A BURN-IN BOARD

[75] Inventor: John D. Gottlieb, Smithtown, N.Y.

[73] Assignee: Standard Microsystems Corporation, Hauppauge, N.Y.

[21] Appl. No.: 172,018

[22] Filed: Jul. 24, 1980

[51] Int. Cl.³ .............................................. B23P 19/04
[52] U.S. Cl. ....................................... 29/829; 29/764; 324/158 F
[58] Field of Search ................. 29/762, 764, 427, 829; 324/158 F

[56] References Cited

U.S. PATENT DOCUMENTS 3,832,764  9/1974  Fletcher et al. ..................... 29/764
3,846,895 11/1974  Cosham et al. ...................... 29/764

OTHER PUBLICATIONS

"Circuit Board Test Fixture", Beckman, Western Electric Technical Digest, No. 43, Jul. 1976, p. 5.

Primary Examiner—Lowell A. Larson
Attorney, Agent, or Firm—Hopgood, Calimafde, Kalil, Blaustein & Judlowe

[57] ABSTRACT

A tool for removing integrated circuit packages from the sockets of a burn-in board includes a plurality of parallel elongated prongs spaced from one another by an amount corresponding to the distance between adjacent rows of sockets on the burn-in board. A cover including a protective layer, such as of foam material, is mounted for pivotal movement with respect to the prongs. To remove the integrated circuit packages from the burn-in board following a burn-in procedure, the prongs are inserted along the longitudinal spaces between adjacent rows of sockets and the free end of the cover is latched to the prongs. The prongs are then lifted upwards, thereby to remove the integrated circuit packages from the sockets.

7 Claims, 7 Drawing Figures

TOOL FOR REMOVING INTEGRATED CIRCUITS FROM A BURN-IN BOARD

The present invention relates generally to the fabrication of semiconductor circuits, and more particularly to an improved tool for removing integrated circuit packages from a burn-in board after a burn-in operation.

As one of the last steps in the fabrication of integrated circuits, the packages in which the semiconductor integrated circuit chips are mounted are subjected to a burn-in operation in which the packages are heated at an elevated temperature in the range of 90° C. to 125° C. for a predetermined time. In a conventional burn-in procedure the leads of a plurality, typically forty, of integrated circuit packages are mounted in sockets mounted on a burn-in board. The sockets are electrically connected through a printed circuit board to which appropriate input logic and power signals are applied so that the integrated circuits receive the appropriate logic and power signals during the burn-in procedure.

The sockets in the typical burn-in board are arranged in a plurality of parallel rows with spaces provided between adjacent rows of sockets. After the completion of the burn-in procedure, the individual integrated circuit packages are removed by the use of a hand tool, which lifts the integrated circuit packages from the sockets in which they were mounted during the burn-in process.

The use of the conventional hand removal tool to remove the heated integrated circuit packages from the sockets of a burn-in board, however, has two serious drawbacks. First, since only one package may be removed from the board at a time, the process of removing all the integrated circuit packages from the board is a time-consuming and thus costly operation. In addition, even when the integrated circuit packages are removed from the burn-in board with the conventional tool with care, the leads of at least some of the integrated circuit packages are invariably bent. If these bent leads are undetected, the integrated circuit will fail electrical tests; if the bent leads are detected, additional time and labor is required to restore the bent leads to their proper orientation with respect to the package. The process of removing the integrated circuit packages is also bothersome to the worker since the packages are still hot when they are removed by the conventional hand tool.

It is, therefore, an object of the invention to provide an improved tool for removing integrated circuit packages from a burn-in board in substantially less time than is presently required by the use of known tools and techniques.

It is a further object of the present invention to provide a tool for removing integrated circuit packages from a burn-in board without bending the leads of the packages.

It is another object of the invention to provide a tool of the type described in which the worker need not touch the heated integrated circuit packages when the packages are removed from the burn-in board.

The tool for removing integrated circuit packages from a burn-in board as provided by the present invention includes a plurality of parallel elongated prongs spaced from one another by an amount corresponding to the distance between adjacent rows of sockets on the burn-in board. A cover including a protective layer, such as of foam material, is mounted for pivotal movement with respect to the prongs. To remove the integrated circuit packages from the burn-in board following a burn-in procedure, the prongs are inserted along the longitudinal spaces between adjacent rows of sockets and the free end of the cover is latched to the prongs. The prongs are then lifted upwards, thereby to remove the integrated circuit packages from the sockets.

To the accomplishment of the above and to such further objects as may hereinafter appear, the present invention relates to a tool for removing integrated circuit packages from a burnin board substantially as defined in the appended claims and as described in the following specification as considered with the accompanying drawings in which:

Figure 2:
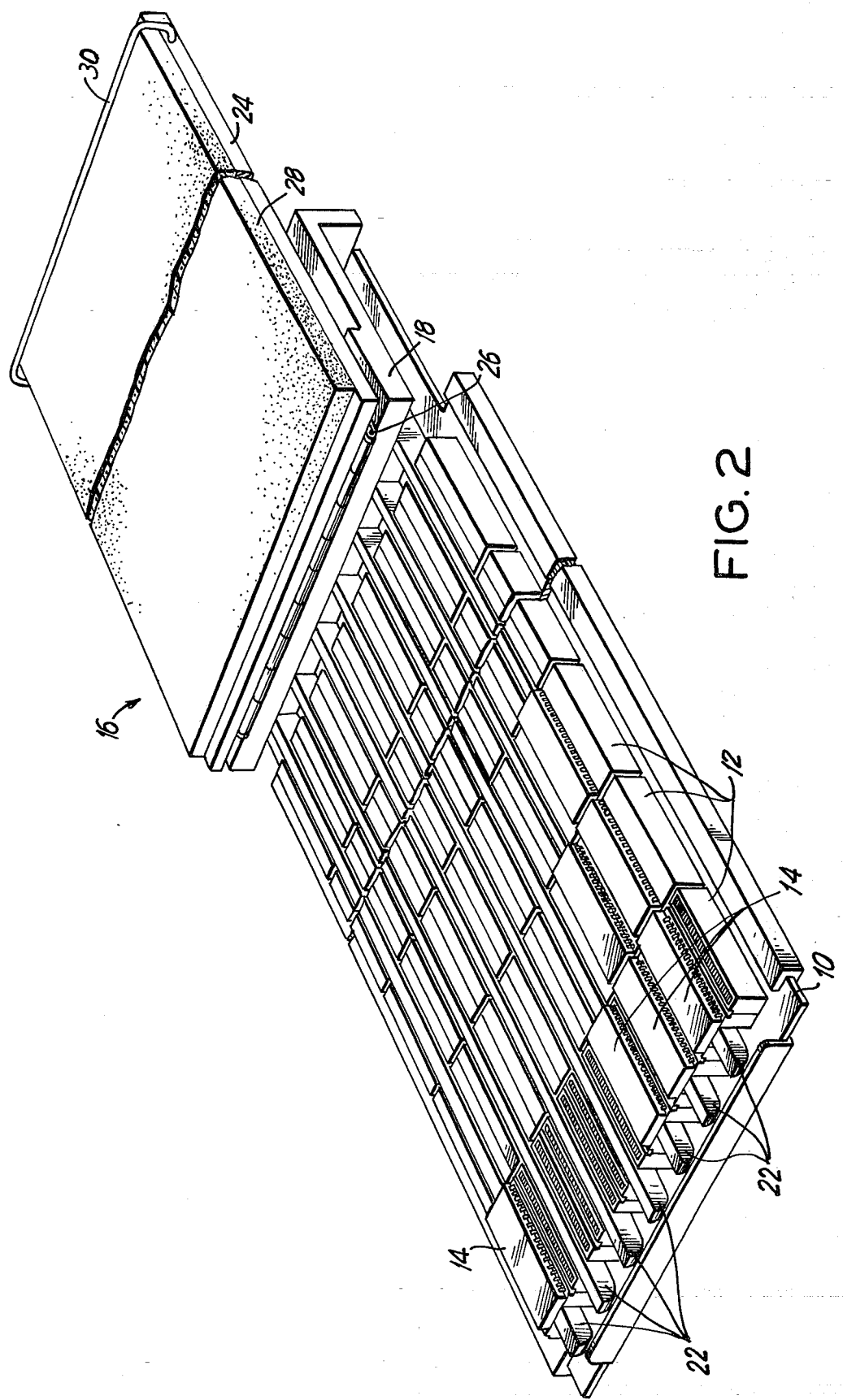
FIG. 2 is a perspective of the package-removal tool of the invention with the cover opened to illustrate the manner in which the prongs are positioned beneath the integrated circuit packages.
Figure 4:
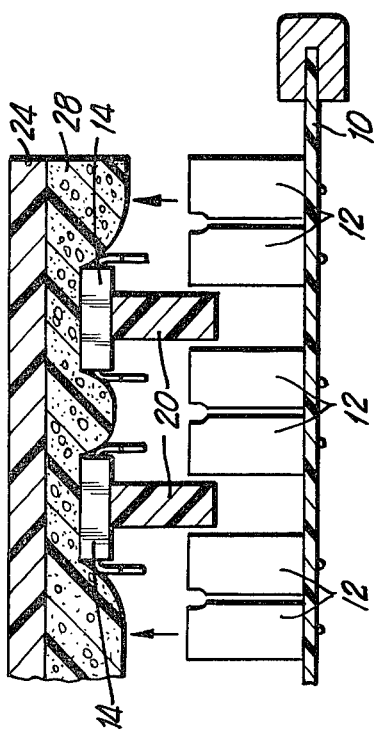
FIG. 4 is a cross section similar to FIG. 3 showing the manner in which the integrated circuit packages are removed from the sockets by the tool of the invention.

As shown in FIG. 2, a conventional integrated circuit burnin board, with which the removal tool of the invention can be used to advantage, includes an insulated base plate 10 on which are mounted a plurality of sockets 12, which receive downwardly extending parallel leads of individual integrated circuit packages 14. The sockets 12 are electrically connected to conducting strips (not shown), which are formed or printed on base plate 10 in a known manner, such that when the burn-in board is connected to a suitable voltage and signal source, logic and power signals are applied to the leads of the integrated circuit packages 14. The leads of the packages 14 are mounted in adjacently spaced sockets 12, in a manner such that the rectangular bodies of the integrated circuit packages extend between or bridge the adjacent rows of sockets, as shown in FIG. 2.

The present invention provides an improved tool to remove the integrated circuit packages 14 from the sockets 12 of the burn-in board after the packages have been heated while mounted in the sockets for a predetermined time during a burn-in procedure. The package removal tool of the invention, generally designated 16, includes an end bracket 18 from which a plurality (here seven) of elongated parallel fingers or prongs 20 extend. The spacing between the prongs is substantially equal to the distance between adjacent rows of sockets on the burn-in board, and the number of the prongs corresponds to the number or rows of sockets on the burn-in board. The free ends of prongs 20 terminate in tapered and curved camming surfaces 22.

A cover 24 is pivotally mounted onto end bracket 18 by means such as a hinge 26, and a layer of protective foam padding 28 is attached to the undersurface of cover 24. A wire latch 30 is loosely secured to the free end of cover 24 opposite to the end pivotally mounted to the end bracket 18.

Figure 1:
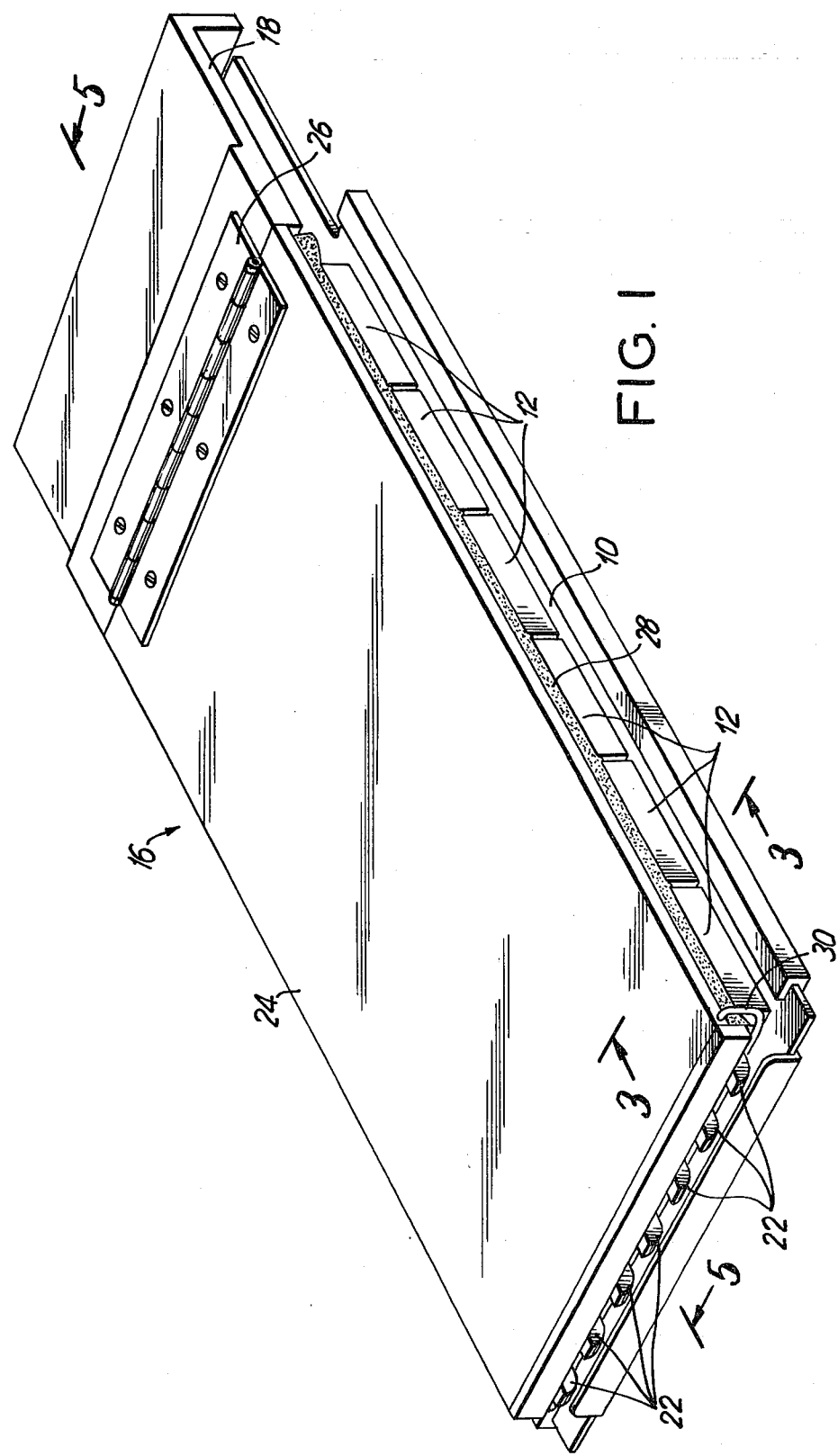
FIG. 1 is a perspective of an embodiment of the package-removal tool of the present invention in its closed condition, as used to remove integrated circuit packages from a burnin board.
Figure 3:
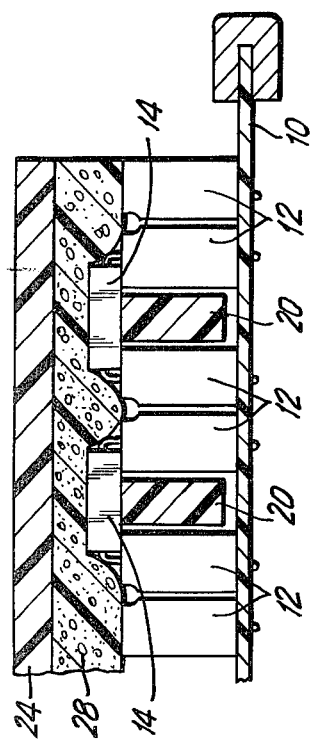
FIG. 3 is a partial cross section taken along the line 3—3 of FIG. 1.

In use, the prongs 20 of the tool 16 are inserted into the spaces between the adjacent parallel rows of sockets, as shown in FIG. 2, with the tapered ends 22 of the prongs 20 extending beyond the outermost sockets and integrated circuit packages. The cover 24 with the attached protective pad 28 is pivoted over the prongs and integrated circuit packages (FIG. 1) so that the integrated circuit packages are retained firmly between the prongs 20 and the protective pad 28 of the removal tool. The wire latch 30 is then placed over the tapered ends 22 of the prongs 20 (FIGS. 1 and 3) to retain the prongs securely to the cover 24. The foam padding 28 protects the integrated circuit packages, which are held between the prongs 20 and the cover 24, from damage during this time.

Figure 5:
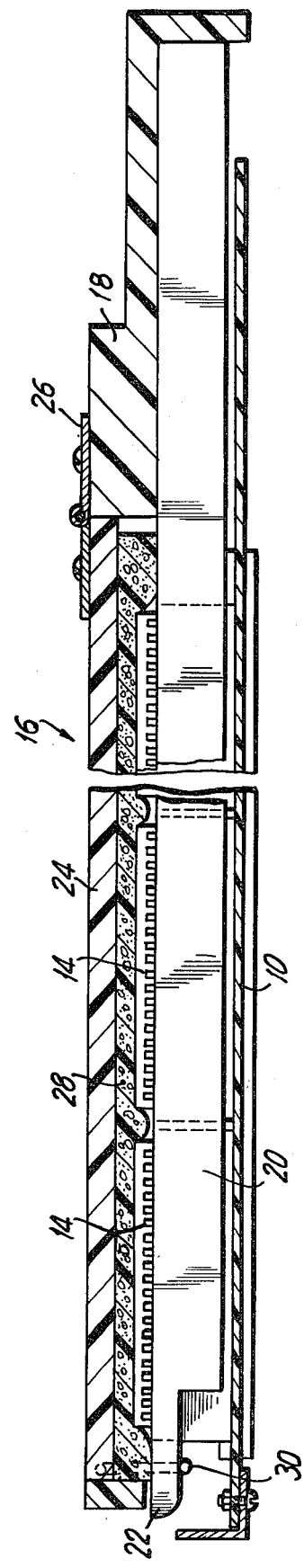
FIG. 5 is a fragmentary cross section taken along line 5—5 of FIG. 1.

The removal tool 16 is then lifted away from the burn-in board, whereby the integrated circuit packages resting on the prongs 20 are all lifted (FIG. 5) at the same time by the prongs away from the sockets while being securely retained without damage to the leads between the prongs 20 and the protective pad 28. All of the integrated circuit packages are thereby removed from the burn-in board without any of the delicate package leads being bent.

Figure 6:
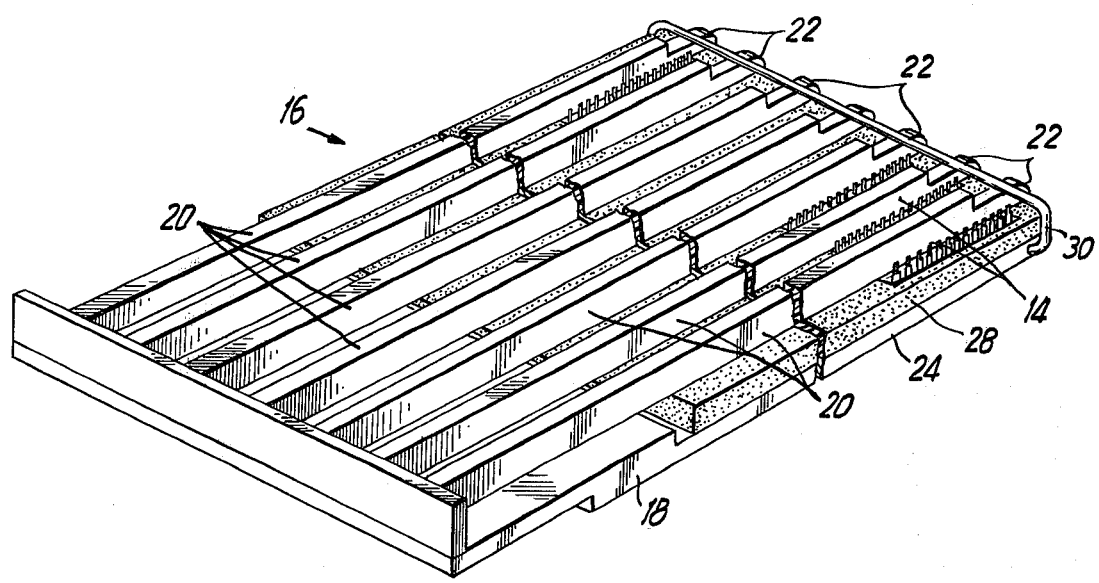
FIG. 6 is a perspective of the package-removal tool of the invention turned over after the integrated circuit packages have been removed from the sockets on the burn-in board.
Figure 7:
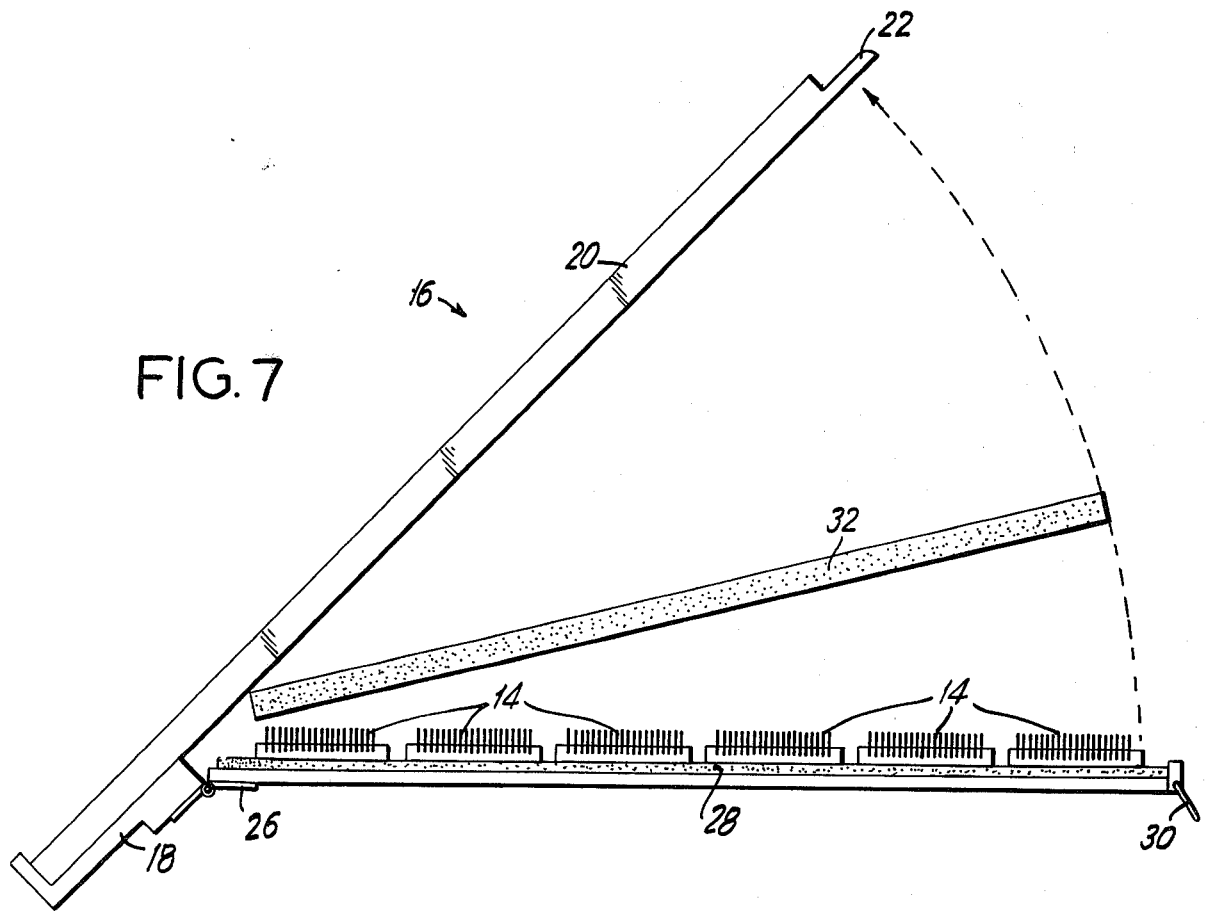
FIG. 7 is a side elevation illustrating the use of a board with the tool of the invention to reposition the integrated circuit packages.

Then, as shown in FIG. 6, the removal tool 16 is turned over and the wire latch 30 is removed from about the ends of the prongs. As shown in FIG. 7, the prongs 20 are pivoted upwards to leave the packages lying upside down on the foam padding 28. The integrated circuit packages may be removed by hand at this time or, as shown in FIG. 7, an additional foam board 32 may be inserted between the prongs 20 and the cover 24.

The cover 24 is then placed up against the foam board 32 and the prongs are urged against the foam board to retain the circuit packages in position between the padding layer 28 and the foam board 32. In this condition, the package-removal tool is again turned over so that the prongs rest on a surface with the foam board 32 resting on the prongs. The cover 24 and the protective foam layer 28 are then pivoted away from the foam board to provide access to the integrated circuit packages, which at this time are positioned freely on the foam board 32 right side up, so that the date code printed on the upper surface of the packages can be viewed for easy code separation.

It will be appreciated from the foregoing description of an embodiment of the invention that the removal tool of the invention permits a relatively unskilled worker, with a minimum of practice, to remove a plurality of integrated circuit packages from a burn-in board in far less time than is now required with the use of the conventional hand tool. In addition, and perhaps of equal importance, the leads on all of the packages are not bent during the removal operation, again in contrast to what frequently occurs when the conventional removal tool is employed. It will also be apparent that modifications may be made to the embodiment of the invention hereinabove specifically described without necessarily departing from the spirit and scope of the invention.

What is claimed is:

1. A tool for use in removing integrated circuit packages from a burn-in board or the like in which a plurality of sockets are mounted in a plurality of spaced parallel rows for receiving the leads of integrated circuit packages, said tool comprising an end bracket, a plurality of enlongated prongs attached to and extending from said end bracket, said prongs being spaced by an amount corresponding to the distance between adjacent rows of sockets on the burn-in board, a cover pivotally mounted to said end bracket, and means for releasably securing said cover to the free ends of said prongs when said prongs are placed along the spaces between the sockets and the underlying integrated circuit packages mounted in the sockets.

2. The tool of claim 1, further comprising a protective layer secured to the underside of said cover.

3. The tool of claim 2, in which said releasable securing means includes a wire loosely mounted to the end of said cover, said prongs each having a reduced width camming portion at their free ends to receive said wire.

4. The tool of claim 1, in which said releasable securing means includes a wire loosely mounted to the end of said cover, said prongs each having a reduced width camming portion at their free ends to receive said wire.

5. A method of removing printed circuit packages from a burn-in board in which integrated circuit packages are mounted in sockets arranged along a plurality of spaced parallel rows, said method comprising the steps of inserting a plurality of elongated prongs in the spaces between adjacent rows of sockets and underlying the integrated circuit packages, securing the free end of a cover to the free ends of said prongs, lifting said cover and prongs as thus secured away from the burn-in board, thereby removing the integrated circuit packages from the sockets, and thereafter releasing the cover from said prongs to allow access to the integrated packages.

6. The method of claim 5, further comprising the step of inserting a protective layer intermediate said cover and said prongs for protecting the packages which are positioned between said prongs and said cover.

7. The method of claim 6, further comprising the steps of interposing a foam board between said prongs and said cover, closing said cover over said foam board and said prongs, turning said tool over, and then opening said cover, whereby the integrated circuit packages are positioned on said foam board with their upper surfaces visible.

* * * * *